United States Patent
Wu

(10) Patent No.: US 8,426,906 B2
(45) Date of Patent: Apr. 23, 2013

(54) METHOD AND STRUCTURE FOR A SEMICONDUCTOR CHARGE STORAGE DEVICE

(75) Inventor: Chao-I Wu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 529 days.

(21) Appl. No.: 12/106,096

(22) Filed: Apr. 18, 2008

(65) Prior Publication Data
US 2009/0261402 A1 Oct. 22, 2009

(51) Int. Cl.
*H01L 29/792* (2006.01)

(52) U.S. Cl.
USPC ...... 257/324; 257/314; 257/325; 257/E21.68; 257/E21.688

(58) Field of Classification Search .................. 257/314, 257/315, 324, 325, 635, E21.21, E21.423, 257/E23.002, E29.309, E21.688; 438/287, 438/591
See application file for complete search history.

(56) References Cited

U.S. PATENT DOCUMENTS

| | | | | |
|---|---|---|---|---|
| 4,616,245 | A * | 10/1986 | Topich et al. | 257/318 |
| 5,739,569 | A * | 4/1998 | Chen | 257/321 |
| 6,413,819 | B1 * | 7/2002 | Zafar et al. | 438/257 |
| 6,972,230 | B1 * | 12/2005 | Pan et al. | 438/257 |
| 7,767,588 | B2 * | 8/2010 | Luo et al. | 438/758 |
| 2003/0047755 | A1 * | 3/2003 | Lee et al. | 257/200 |
| 2003/0103383 | A1 * | 6/2003 | Fan et al. | 365/185.28 |
| 2005/0214996 | A1 * | 9/2005 | Yoshino | 438/197 |
| 2007/0064468 | A1 * | 3/2007 | Seol et al. | 365/129 |

FOREIGN PATENT DOCUMENTS

CN 1705087 A 12/2005

OTHER PUBLICATIONS

Nomoto et al., Analytical Model of the Programming Characteristics of Scaled MONOS Memories with a Variety of Trap Densities and a Proposal of a Trap-Density-Modulated MONS Memory; IEEE; 2001; pp. 13.5.1-13.5.4.
Wann et al., High Endurance Ultra-Thin Tunnel Oxide for Dynamic Memory Application; IEEE; 1995; pp. 34.6.1-34.6.4.

* cited by examiner

*Primary Examiner* — Jarrett Stark
(74) *Attorney, Agent, or Firm* — Kilpatrick Townsend & Stockton LLP

(57) ABSTRACT

A semiconductor charge storage device includes a semiconductor substrate having a surface region. The semiconductor substrate is characterized by a first conductivity type. A charge trapping material overlies and is in contact with at least a portion of the surface region of the semiconductor substrate. The charge trapping material is characterized by a first dielectric constant and by a first charge trapping capability. The first dielectric constant is higher than a dielectric constant associated with silicon oxide. A dielectric material overlies and is in contact with at least a portion of the charge trapping material. The dielectric material is formed using a conversion of a portion of the charge trapping material for providing a second charge trapping capability. The device also includes a conductive material overlying the second dielectric. The conductive material is capable of receiving an electrical signal to cause electrical charges being trapped in the semiconductor charge storage device.

15 Claims, 6 Drawing Sheets

METHOD AND STRUCTURE FOR A SEMICONDUCTOR CHARGE STORAGE DEVICE

BACKGROUND OF THE INVENTION

The present invention is directed to integrated circuits and their processing for the manufacture of semiconductor devices. More particularly, the invention provides a method and structure for increasing charge trapping capability in a semiconductor charge storage device. Merely by way of example, the invention has been applied to dynamic random access memory (DRAM) application. But it would be recognized that the invention has a much broader range of applicability.

Semiconductor memory devices are commonly used many applications in digital electronics. One specific type of semiconductor memory device, dynamic random access memory, often known as DRAM, is often used in computer main memory, video processing, HDTV, etc. Therefore, DRAM plays an increasingly important role in modern electronic systems. On the other hand, conventional DRAM suffers from many limitations.

Specifically, conventional DRAM includes an MOS capacitor for charge storage and a transistor for access control. Because the capacitor tends to lose charges, conventional DRAM requires frequent refreshing operation to replenish lost charges. Continued miniaturization of a conventional DRAM cell also tends to be restricted by the size storage capacitor that is required to hold a minimum amount of charges.

Accordingly, there is a need for improved techniques for a semiconductor charge storage device.

BRIEF SUMMARY OF THE INVENTION

The present invention is directed to integrated circuits and their processing for the manufacture of semiconductor devices. More particularly, the invention provides a method and structure for increasing charge trapping capability in a semiconductor charge storage device. Merely by way of example, the invention has been applied to dynamic random access memory (DRAM) application. But it would be recognized that the invention has a much broader range of applicability.

According to a specific embodiment, the invention provides a dynamic random memory (DRAM) charge storage device including a semiconductor substrate having a surface region. The semiconductor substrate is characterized by a first conductivity type. A charge trapping material overlies and is in contact with at least a portion of the surface region of the semiconductor substrate. The charge trapping material is characterized by a first dielectric constant and by a first charge trapping capability. In a specific embodiment, the first dielectric constant is higher than a dielectric constant associated with silicon oxide. The device includes a dielectric material overlying and being in contact with at least a portion of charge trapping material. In a specific embodiment, the dielectric material is formed by conversion of a portion of the charge trapping material. In an embodiment, the dielectric material is formed using a thermal oxidation process for providing a higher charge trapping capability. In an embodiment, the charge trapping material and the dielectric material form a composite dielectric characterized by a second charge trapping capability. The second charge trapping capability is higher than the first charge trapping capability. In a specific embodiment, the dielectric material is formed by partially oxidizing the charge trapping material in a thermal process. The device also includes a conductive material overlying the second dielectric. The conductive material is capable of receiving an electrical signal to cause electrical charges being trapped in the semiconductor charge storage device.

In a specific embodiment of the device, the semiconductor substrate includes a silicon substrate. In an embodiment, the first dielectric constant is higher than 3.9. In some embodiments, the charge trapping material is characterized by a first dielectric constant which is higher than a dielectric constant associated with silicon oxide. In a specific embodiment, the charge trapper material includes silicon nitride. In another embodiment, the charge trapping material is selected from a group consisting of $HfO_2$, $HfSiO$, $Al_2O_3$, and $ZrO_2$. In some embodiments, the charge trapping material is in contact with a portion of the surface region of the semiconductor substrate. In an embodiment, the portion of the surface region includes bare semiconductor surface. In an embodiment, the surface region of the semiconductor substrate includes a layer of native oxide. In another embodiment, the surface region of the semiconductor substrate includes a layer of silicon oxide. The layer of silicon oxide has a thickness selected to allow charge tunneling. For example, in a specific embodiment, the layer of silicon oxide may have a thickness of 15 Å or less. In a specific embodiment, the second charge trapping capability enables an additional threshold voltage shift in the device of more than 1.0 volts over the first charge trapping capability. In an embodiment of the invention, the semiconductor charge storage device is characterized by a third charge trapping capability which is higher than the first charge trapping capability for an equivalent electrical oxide thickness (EOT). In an embodiment, the conductive material includes polysilicon. In an embodiment, the charge storage device forms part of a storage capacitor in a DRAM. In a specific embodiment, the semiconductor substrate also includes a source region characterized by a second conductivity type, a drain region characterized by the second conductivity type, a channel region of the first conductivity type sandwiched between the source region and the drain region, the channel region including a portion of the surface region of the semiconductor substrate, and a gate electrode which includes the conductive material. Depending on the embodiment, the conductive material may include doped polysilicon or metal.

According to an alternative embodiment of the invention, a method is provided for forming a semiconductor charge storage device. The method includes providing a semiconductor substrate having a surface region, the semiconductor substrate being characterized by a first conductivity type. The method includes forming a charge trapping material overlying and being in contact with at least a portion of the surface region of the semiconductor substrate. The charge trapping material is characterized by a first dielectric constant and by a first charge trapping capability. The first dielectric constant is higher than a dielectric constant associated with silicon oxide. In an embodiment, the method includes converting a portion of the charge trapping material to form a dielectric material for providing a second charge trapping capability. In a specific embodiment, the charge trapping material is then partially oxidized using a thermal oxidation process to form a dielectric material. The method also includes adding a conductive material overlying the dielectric. The conductive material is capable of receiving an electrical signal to cause electrical charges being trapped in the semiconductor charge storage device.

In a specific embodiment of the method, the semiconductor substrate includes silicon. In an embodiment, the first dielectric constant is higher than 3.9. In a specific example, the charge trapping material includes silicon nitride. In an example, the first dielectric is formed by a chemical vapor deposition (CVD) process. In another example, the charge trapping material is selected from a group consisting of $HfO_2$, HfSiO, $Al_2O_3$, and $ZrO_2$. In a specific embodiment, the dielectric material is formed by partially oxidizing the first dielectric in a thermal process. In an embodiment, the surface region of the semiconductor substrate includes a layer of native oxide. In another embodiment, the surface region of the semiconductor substrate includes a layer of silicon oxide, the layer of silicon oxide being characterized by a thickness selected to allow charge tunneling. For example, in a specific embodiment, the layer of silicon oxide may have a thickness of 15 Å or less. In a specific embodiment, the method also includes providing a source region in the semiconductor substrate, the source region being characterized by a second conductivity type, providing a drain region in the semiconductor substrate, the drain region being characterized by the second conductivity type; and providing a channel region of the first conductivity type sandwiched between the source region and the drain region, the channel region including a portion of the surface region of the semiconductor substrate, and providing a gate electrode which includes the conductive material. For example, the conductive material may include metal or doped polysilicon.

According to a specific embodiment, the invention provides a semiconductor charge storage device, which includes a semiconductor substrate having a surface region. The semiconductor substrate is characterized by a first conductivity type. The device includes a source region, a drain region, and a channel region. The source region is characterized by a second conductivity type. The drain region is characterized by the second conductivity type. The channel region is sandwiched between the source region and the drain region. The channel region is characterized by the first conductivity type and includes a portion of the surface region of the semiconductor substrate. The device also includes a first dielectric overlying and being in contact with at least a portion of the surface region of the semiconductor substrate. The first dielectric is characterized by a first dielectric constant higher than a dielectric constant associated with silicon oxide. The first dielectric is also characterized by a first charge trapping capability. A second dielectric overlies the first dielectric, the second dielectric being formed using a thermal oxidation process for providing a second charge trapping capability. The device also includes a conductive material overlying the second dielectric, the conductive material being capable of receiving an electrical signal to cause electrical charges being trapped in the semiconductor charge storage device.

In an embodiment of the above device, the surface region of the semiconductor substrate includes a layer of native oxide. In another embodiment, the surface region of the semiconductor substrate includes a layer of silicon oxide, the layer of silicon oxide being characterized by a thickness selected to allow charge tunneling. For example, in a specific embodiment, the layer of silicon oxide may have a thickness of 15 Å or less.

According to yet another embodiment, the invention provides a polysilicon-oxide-nitride-silicon charge storage device, which includes a silicon substrate having a surface region, the silicon substrate being characterized by a first conductivity type. The device includes a source region in the silicon substrate, the source region being characterized by a second conductivity type. The device includes a drain region in the silicon substrate, the drain region being characterized by the second conductivity type. The device includes a channel region in the silicon substrate sandwiched between the source region and the drain region. The channel region is characterized by the first conductivity type and includes a portion of the surface region of the silicon substrate. The device includes a silicon nitride layer overlying and being in contact with at least a portion of the surface region of the silicon substrate. A second dielectric overlies the silicon nitride layer. The second dielectric is formed by converting a portion of the silicon nitride layer in an oxygen ambient. The first dielectric and the second dielectric forms a composite dielectric characterized by a second charge trapping capability which is higher than the first charge trapping capability. The device further includes a polysilicon layer overlying the second dielectric. The polysilicon layer is capable of receiving an electrical signal to cause electrical charges being trapped in the semiconductor charge storage device.

In an embodiment of the polysilicon-oxide-nitride-silicon charge storage device, the charge storage device is characterized by a second charge trapping capability which is higher than the first charge trapping capability for an equivalent electrical oxide thickness (EOT). In a specific embodiment, the second charge trapping capability enables an additional threshold voltage shift of more than 1.0 volts in the charge storage device over the first charge trapping capability. In an embodiment, the portion of the surface region comprises bare silicon surface. In an embodiment, the surface region of the semiconductor substrate includes a layer of native oxide. In another embodiment, the surface region of the semiconductor substrate includes a layer of silicon oxide, the layer of silicon oxide being characterized by a thickness selected to allow charge tunneling.

Many benefits are achieved by way of the present invention over conventional techniques. For example, in an embodiment, the present invention provides a method for increasing charge trapping capability using a dielectric formed by thermal oxidation of silicon nitride. In another embodiment, the invention provides methods for increasing charge trapping capability using a dielectric formed by thermal conversion of high-dielectric constant (High-K) dielectrics. In a specific embodiment, the invention provides a semiconductor charge storage device with increased charge trapping capability using a dielectric formed by thermal conversion of high-dielectric constant (High-K) dielectrics. For example, a polysilicon-oxide-nitride-silicon device (PONIS) provides increased charge tapping capability and efficient programming suitable for DRAM application. In another embodiment, the invention provides a polysilicon-oxide-nitride-oxide-silicon device (PONOS) with increased charge tapping capability. Additionally, the method provides processes that are compatible with conventional process technology without substantial modifications to conventional equipment and processes. Depending upon the embodiment, one or more of these benefits may be achieved. These and other benefits will be described in more detail throughout the present specification and more particularly below.

Various additional objects, features, and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and structure for increasing charge trapping capability in a semiconductor charge storage device. Merely by way of example, the invention has been applied to dynamic random access memory (DRAM) application. But it would be recognized that the invention has a much broader range of applicability.

Even though DRAM is useful in many electronic applications, conventional DRAM suffers from many limitations. For example, a memory cell in a conventional DRAM usually requires an MOS capacitor for storing charges and a transistor switch for access control. It can be difficult to shrink the memory cell, because a certain size of the capacitor is needed to store the amount of charges for memory operation. Additionally, MOS capacitors are known to lose charges during memory operation. Therefore a frequent memory refresh is needed in a conventional DRAM, resulting in complex circuitry and large device area.

Alternative memory structures have been proposed to store charges in traps centers in dielectrics such as silicon nitride. However, these structures often require high voltage for programming and often do not provide sufficient charge storage capacity or speed for DRAM applications.

Depending upon the embodiment, the present invention includes various features, which may be used. These features include the following:
1. A method for increasing charge trapping capability using a dielectric formed by thermal conversion of silicon nitride;
2. Alternative methods for increasing charge trapping capability using a dielectric formed by thermal conversion of high-dielectric constant (High-K) dielectrics;
3. A semiconductor charge storage device with increased charge trapping capability using a dielectric formed by thermal conversion of high-dielectric constant (High-K) dielectrics;
4. A polysilicon-oxide-nitride-silicon device (PONIS) with increased charge tapping capability;
5. A polysilicon-oxide-nitride-oxide-silicon device (PONOS) with increased charge tapping capability; and
6. A semiconductor charge storage device which provides increased charge tapping capability and efficient programming suitable for DRAM application.

As shown, the above features may be in one or more of the embodiments to follow. These features are merely examples, which should not unduly limit the scope of the claims herein. One of ordinary skill in the art would recognize many variations, modifications, and alternatives.

Figure 1:
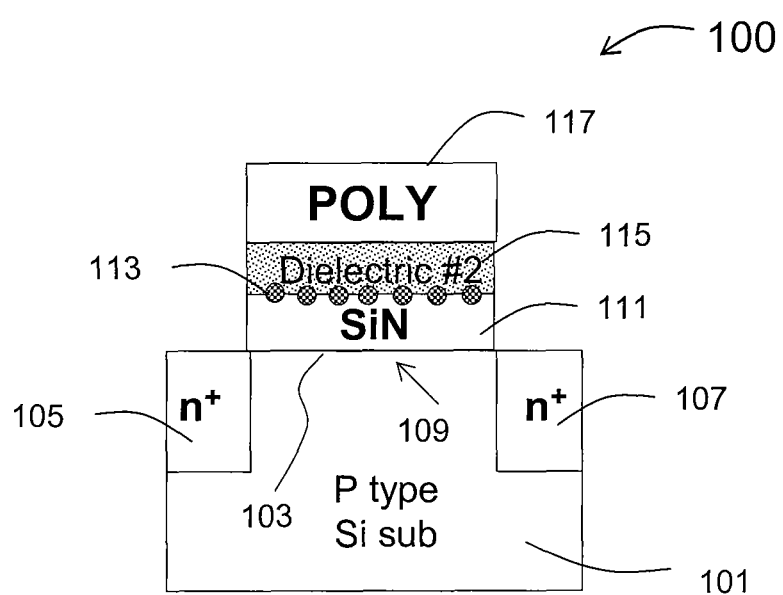
FIG. 1 is a simplified cross-sectional view diagram illustrating a semiconductor charge storage device according to an embodiment of the present invention.

FIG. 1 is a simplified cross-sectional view diagram illustrating a semiconductor charge storage device according to an embodiment of the present invention. This diagram is merely an example, which should not unduly limit the scope of the claims herein. One of ordinary skill in the art would recognize other variations, modifications, and alternatives. In this example, semiconductor charge storage device 100 is a silicon based device. As shown, charge storage device 100 includes a polysilicon-oxide-nitride-semiconductor (PONIS) structure. In the particular embodiment, charge storage device 100 includes a P-type silicon substrate 101 having a surface region 103. Device 100 includes N-type source region 105 and an N-type drain region in the silicon substrate. A channel region 109 is in the silicon substrate sandwiched between the source region 105 and the drain region 107. The channel region 109 is characterized by P-type conductivity type and includes a portion of surface region 103 of the silicon substrate.

In an embodiment, charge storage device 100 includes a first dielectric 111, e.g. a silicon nitride layer, overlying and being in contact with the surface region 103 of the silicon substrate 101. A second dielectric 115 overlies the silicon nitride layer. In an embodiment, the second dielectric 115 is formed by a thermal conversion process for providing a second charge trapping capability. Charge storage device 100 also includes a polysilicon layer 117 overlying the second dielectric 115. The polysilicon layer 117 is capable of receiving an electrical signal to cause electrical charges being trapped in the semiconductor charge storage device.

In a specific embodiment, dielectric layer 115 is formed by thermally oxidization of a silicon nitride material. In the specific example of FIG. 1, the first dielectric 111 is a silicon nitride layer, which provides a charge trapping capability in the charge storage device 100. In alternative embodiment, the first dielectric material 111 can be any dielectric material which provided charge trapping capability. For example, dielectric 101 may include high dielectric constant (High-K) materials such as $HfO_2$, $HfSiO$, $Al_2O_3$, and $ZrO_2$, etc. In a specific embodiment, layer 111 may be a dielectric material having the first dielectric constant is higher than 3.9.

In a specific embodiment, the second dielectric 115 is formed using thermal oxidation process to thermally oxidize part of a silicon nitride material. In certain embodiments, the second dielectric layer may include silicon oxide. In other embodiments, the second dielectric layer may include nitrogen in the silicon oxide. In yet another embodiment, the second dielectric may include combinations of silicon, oxygen, and nitrogen. In an embodiment part of the unoxidized silicon nitride material forms the first dielectric layer 111. In other embodiments, a high-K dielectric can be oxidized to form the second dielectric.

As discussed above, the first dielectric 111 overlies and is in contact with at least a portion of the surface region 103 of the substrate. In certain embodiments, the surface region includes bare silicon surface. In some embodiments, the surface region may include a native oxide layer, which is understood in the art as including materials formed on the surface of a silicon substrate due to exposure to chemicals used in wafer cleaning or due to exposure to ambient air during wafer processing. For example, the surface region may include silicon oxide formed when the silicon substrate is loaded in a process chamber. In alternative embodiments, the surface region may include a thin layer of silicon oxide that is formed by exposing the silicon substrate in to a thermal oxidation process. As discussed below, the thickness of this silicon oxide is selected to allow efficient programming, for example, in a DRAM application. For example, in a specific embodiment, the layer of silicon oxide may have a thickness of 15 Å or less.

Figure 2:
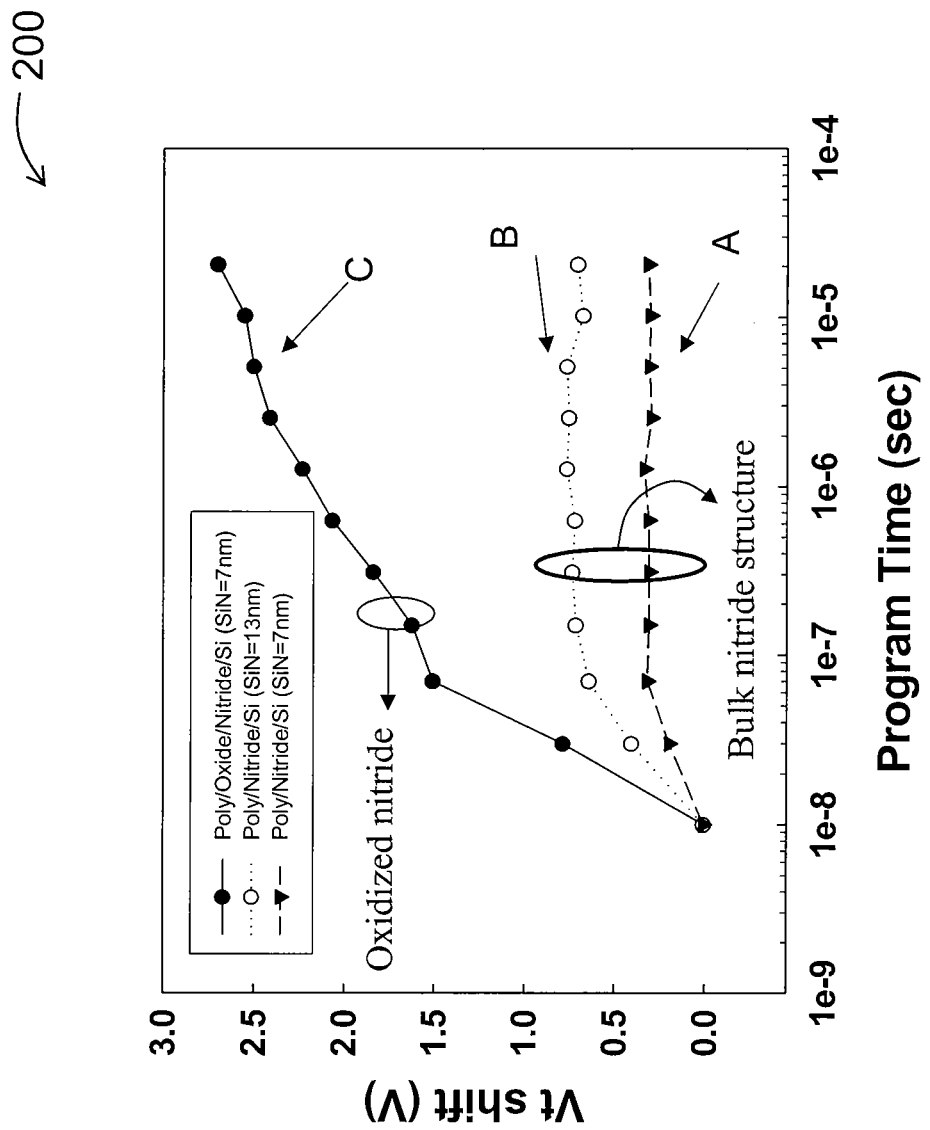
FIG. 2 is a simplified diagram illustrating an example of charge trapping capability of a charge storage device according to an embodiment of the present invention.

According to an embodiment of the present invention, the charge trapping capability of a silicon nitride layer can be substantially increased if a second dielectric layer is formed by thermally oxidizing the silicon nitride layer. In order to confirm this result, we have performed experiments in which MOS transistors are stressed with an applied electrical signal, such as a constant voltage signal. The electrical charges trapped in the trapping centers in the dielectric of the transistor can cause a threshold voltage (Vt) shift. The amount of Vt shift is often used as a measure of the charge trapping capability of the dielectric. FIG. 2 is a simplified diagram illustrating an example of charge trapping capability of a charge storage device according to an embodiment of the present invention. This diagram is merely an example, which should not unduly limit the scope of the claims herein. One of ordinary skill in the art would recognize other variations, modifications, and alternatives. As shown, FIG. 2 shows threshold voltage (Vt) shifts as a function of program time for three devices. Device A shows has a 7 nm silicon nitride dielectric. Device B has a 13 nm silicon nitride dielectric. Device C has a dielectric formed by partially oxidizing a 7 nm silicon nitride dielectric according to an embodiment of the present invention similar to the charge storage device 100 discussed above. As can be seen in FIG. 2, device C, which has the oxidized nitride dielectric demonstrate the largest amount of Vt shift. Device C and device B have similar electrical oxide thickness (EOT), i.e., the two devices exhibit similar electrical device characteristics, such as Vt and capacitance, of a certain oxide thickness. Clearly, the result in FIG. 2 suggests an increased charge trapping capability in device C. In particular, the threshold voltage shift in device B seems to saturate at a level below 1.0 volts, whereas device C exhibit threshold voltage shift of more than 2.0 volts. Thus charge trapping capability of device C enables an additional threshold voltage shift of more than 1.0 volts over the charge trapping capability of device B. Of course, there can be other variations, modifications, and alternatives.

Referring to FIG. 1, the increase charge trapping capability is indicated by the trapping centers 113 shown in circular patterns. It is to be understood that this simplified diagram is only an example for demonstration purposes. The increased trapping capability may be due to trapping centers at the interface of between first dielectric and the second dielectric. It can also be due to trapping centers internal to the second dielectric. As the second dielectric is formed by thermal oxidation of the silicon nitride, the second dielectric may include silicon oxide and may also include other combinations of silicon, oxygen, and nitrogen.

According to embodiments of the invention, charge storage device 100 can be used as a memory cell in a dynamic random access memory (DRAM) application. In an embodiment, the increase charge trapping capability and dielectric contact with the substrate allow more efficient programming, i.e., the device can be programmed using lower voltage and shorter time. These properties can be used advantageously in DRAM applications. Even though certain amount of charge loss may still be present, the charge loss can be replenished by periodic refresh operation commonly employed in DRAM. According to embodiments of the invention, less refresh operation is required for charge storage device 100, because charge retention at trapping centers is often substantially longer than conventional DRAM which uses MOS capacitors for charge storage.

As discussed above in connection with FIG. 1, substrate 101 may include a native oxide layer in a specific embodiment of the invention. According to embodiments of the invention, such native oxide layer still allow efficient programming though contact of the first dielectric and the substrate. Additionally, the refresh operation may still be required, because the presence of the native oxide may not provide sufficient charge retention.

Figure 3:
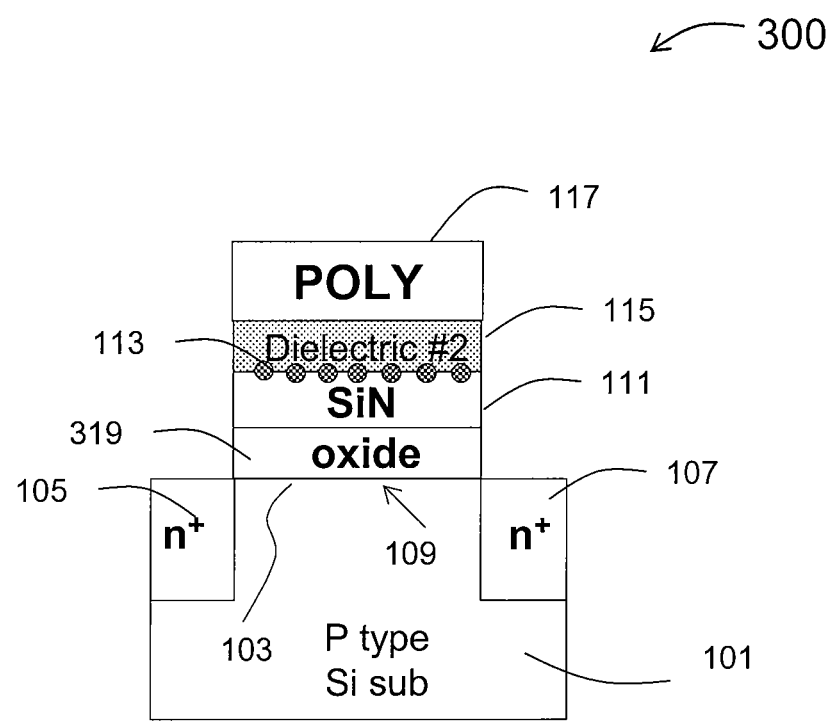
FIG. 3 is a simplified cross-sectional view diagram illustrating another semiconductor charge storage device according to an alternative embodiment of the present invention.

FIG. 3 is a simplified cross-sectional view diagram illustrating another semiconductor charge storage device 300 according to an alternative embodiment of the present invention. This diagram is merely an example, which should not unduly limit the scope of the claims herein. One of ordinary skill in the art would recognize other variations, modifications, and alternatives. It can be seen that charge storage device 300 includes similar components as device 100 in FIG. 1. One notable difference is that a silicon oxide layer 319 overlying the surface region 103 of the substrate 101. In this embodiment, the thickness of silicon oxide 319 is chosen to allow charge tunneling for efficient programming and without necessarily providing of charge retention capability of a thick thermal oxide. For example, in a specific embodiment, the layer of silicon oxide may have a thickness of 15 Å or less. Of course, there can be other variations, modifications, and alternatives.

Figure 4:
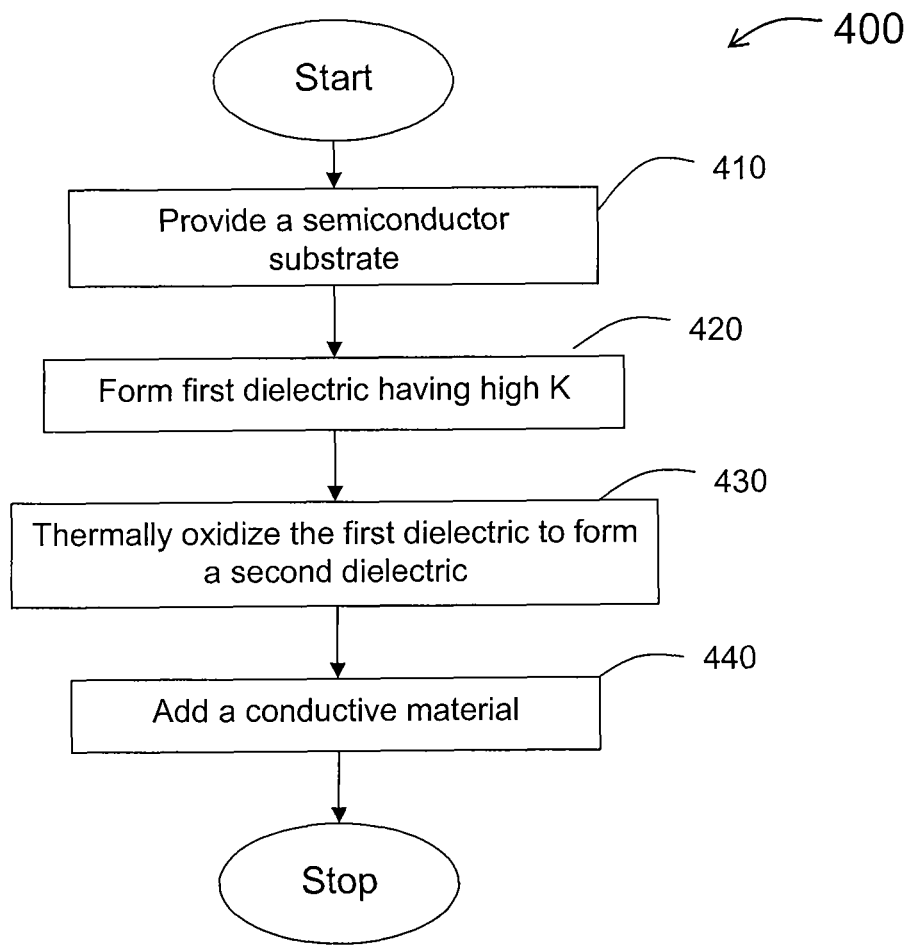
FIG. 4 is a simplified flow diagram illustrating a method for forming a semiconductor charge storage device according to an embodiment of the present invention.

FIG. 4 is a simplified flow diagram illustrating a method for forming a semiconductor charge storage device according to an embodiment of the present invention. As shown, the method for forming a semiconductor charge storage device can be briefly summarized below.

1. (Process 410) Provide a semiconductor substrate;
2. (Process 420) Form a first dielectric overlying and being in contact with at least a portion of the surface region of the semiconductor substrate;
3. (Process 430) Thermally oxidize the first dielectric to form a second dielectric for providing increased charge trapping capability; and
4. (Process 440) Add a conductive material overlying the second dielectric for receiving an electrical signal to cause charges being trapped in the semiconductor charge storage device.

The method is discussed below in more detail with reference to FIGS. 5-8.

Figure 5:
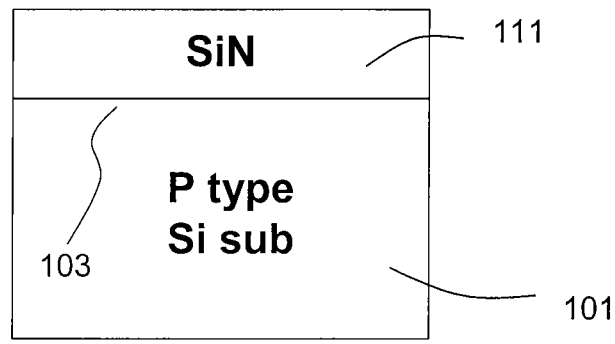
FIGS. 5-8 are simplified cross-sectional view diagrams illustrating a method for forming a semiconductor charge storage device according to an embodiment of the present invention.

FIGS. 5-8 are simplified cross-sectional view diagrams illustrating a method for forming a semiconductor charge storage device according to an embodiment of the present invention. These diagrams are merely examples, which should not unduly limit the scope of the claims herein. One of ordinary skill in the art would recognize other variations, modifications, and alternatives. In FIG. 5, the method includes providing a semiconductor substrate 101 having a surface region 103. In this particular example, the semiconductor substrate is a P-type silicon substrate. Of course an N-type substrate can be used in another embodiment. In alternative embodiments, other semiconductor materials such as germanium can be used. The method includes forming a first dielectric overlying and in contact with the surface region of the semiconductor substrate. In an embodiment, the first dielectric includes a charge trapping material. In a specific embodiment, the first dielectric is a silicon nitride layer 111, which provides charge trapping capability. In an example, the silicon nitride layer may be deposited on the substrate using a chemical vapor deposition (CVD) process. Alternatively, a low-pressure chemical vapor deposition (LPCVD) process can be used.

Figure 6:
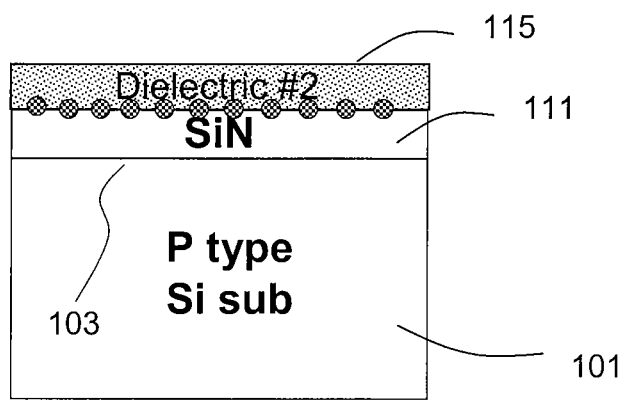

In FIG. 6, the first dielectric is thermally oxidized to form a second dielectric 115 for providing a second charge trapping capability. In an embodiment, the oxidation process may be carried out at a temperature range of approximately 900° C.-1100° C. The oxidation may be at atmospheric pressure or at a low pressure. In a specific embodiment, the starting silicon nitride thickness is about 133 Å. After a thermal oxidation process, approximately 90 Å of second dielectric 115 is formed on the remaining 70 Å of silicon nitride 111. In other embodiments, the starting silicon nitride may have a thickness in the range of approximately 30 Å to 200 Å, and the second dielectric may have a thickness in a range of approximately 10 Å to 150 Å, whereas the remaining silicon nitride may have a thickness in a range of approximately 30 Å to 10 Å.

Figure 7:
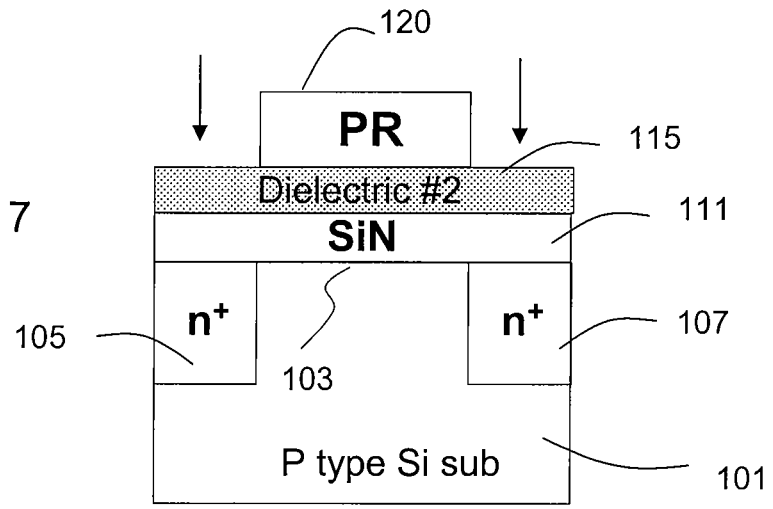
Figure 8:
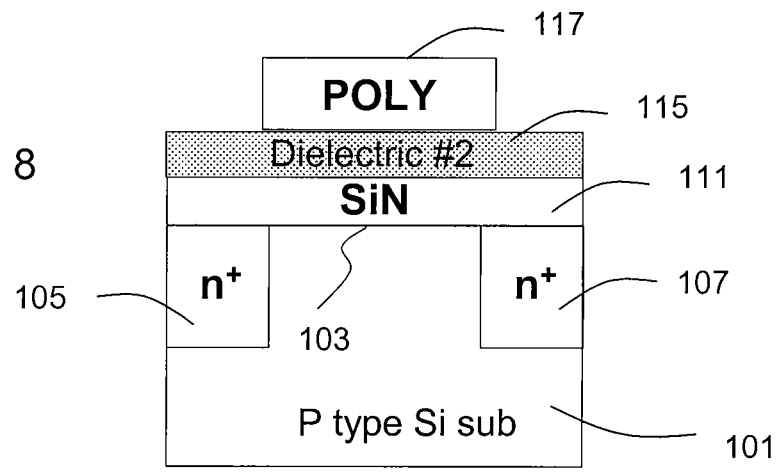

In FIG. 7, a photoresist layer 120 is formed and patterned to form a mask for ion implantation. A source/drain implant is carried out, and the photoresist layer is removed. In FIG. 8, a conductive layer 117, e.g. doped polysilicon, is deposited and then patterned to form a gate electrode of the device. Alternatively, a conventional self-aligned process can be used to form the polysilicon gate and source/drain region. For example, after the structure in FIG. 6 is formed, a polysilicon layer is deposited and patterned. Then the patterned polysilicon gate is used as mask for source/drain implant. Subsequently, conventional back end process. such as contact formation and passivation, can be carried out.

In an alternative embodiment, the first dielectric material 111 may be a charge trapping material which provided charge trapping capability. For example, dielectric 111 may include high dielectric constant (High-K) materials such as $HfO_2$, $HfSiO$, $Al_2O_3$, and $ZrO_2$, etc. In a specific embodiment, layer 111 can be a dielectric material having the first dielectric constant is higher than 3.9.

As discussed above, the first dielectric 111 overlies and is in contact with at least a portion of the surface region 103 of the substrate. In certain embodiments, the surface region may include a native oxide layer, which is understood in the art to include a material formed on the surface of a silicon substrate due to exposure to chemicals used in wafer cleaning or due to exposure to ambient air during wafer processing. For example, the surface region may include silicon oxide formed when the silicon substrate is loaded in a process chamber.

In an alternative embodiment, in FIG. 5, a silicon oxide layer 319 (not shown) is formed overlying the surface region 103 of the substrate 101. Then silicon nitride layer 111 is formed over the silicon oxide layer 319. In this embodiment, the thickness of silicon oxide 319 is chosen allow charge tunneling for efficient programming at relatively low voltages. For example, in a specific embodiment, the layer of silicon oxide may have a thickness of 15 Å or less. A simplified diagram of a charge storage device according to this embodiment of the method is shown in FIG. 3.

The above sequence of processes provides a method for forming a semiconductor charge storage device according to an embodiment of the present invention. As shown, the method uses a combination of processes including forming a High-K dielectric having charge trapping capability and using a thermal oxidation process to increase the charge trapping capability. Other alternatives can also be provided where processes are added, one or more processes are removed, or one or more processes are provided in a different sequence without departing from the scope of the claims herein. Further details of the present method can be found throughout the present specification.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A charge storage device comprising:
a semiconductor substrate having a surface region;
a charge trapping material overlying and in direct contact with the surface region of the semiconductor substrate, the charge trapping material being characterized by a first dielectric constant which is higher than a dielectric constant associated with silicon oxide, the charge trapping material being also characterized by a first charge trapping capability;
a dielectric material being formed by converting a portion of the charge trapping material, the charge trapping material and the dielectric material forming a composite dielectric characterized by a second charge trapping capability, the second charge trapping capability being higher than the first charge trapping capability; and
a conductive material overlying the dielectric material, the conductive material being capable of receiving an electrical signal to cause electrical charges being trapped in the charge storage device;
wherein the first and the second charge trapping capabilities are associated with threshold voltage shifts caused by electrical charges being trapped in the charge storage device.

2. The charge storage device of claim 1 wherein the semiconductor substrate comprises silicon.

3. The charge storage device of claim 1 wherein the charge trapping material comprises silicon nitride.

4. The charge storage device of claim 1 wherein the dielectric material comprises silicon oxide.

5. The charge storage device of claim 1 wherein the second charge trapping capability enables an additional threshold voltage shift of more than 1.0 volts in the device as compared with the first charge trapping capability.

6. The charge storage device of claim 1 wherein the charge trapping material is in contact with a portion of the surface region of the semiconductor substrate, the portion of the surface region comprises bare semiconductor surface.

7. The charge storage device of claim 1 further comprising:
a source region characterized by a second conductivity type;
a drain region characterized by the second conductivity type;
a channel region of the first conductivity type sandwiched between the source region and the drain region, the channel region including a portion of the surface region of the semiconductor substrate; and
a gate electrode, the gate electrode including the conductive material.

8. The charge storage device of claim 1 wherein converting the portion of the charge trapping material includes oxidizing the portion of the charge trapping material.

9. A charge storage device comprising:
a semiconductor substrate having a surface region;
a charge trapping material overlying and in direct contact with the surface region of the semiconductor substrate, the charge trapping material being characterized by a first dielectric constant which is higher than a dielectric constant associated with silicon oxide, the charge trapping material being also characterized by a first charge trapping capability;
a dielectric material being formed by converting a portion of the charge trapping material;
an interface charge trapping region between the dielectric material and the charge trapping material; and a conductive material overlying the dielectric material, the conductive material being capable of receiving an electrical signal to cause electrical charges being trapped in the charge storage device;

wherein the charge trapping material, the interface charge trapping region, and the dielectric material form a composite dielectric characterized by a second charge trapping capability, the second charge trapping capability being higher than the first charge trapping capability;

wherein the first and the second charge trapping capabilities are associated with threshold voltage shifts caused by electrical charges being trapped in the charge storage device.

10. The charge storage device of claim 9 wherein the second charge trapping capability enables an additional threshold voltage shift of more than 1.0 volts in the device as compared with the first charge trapping capability.

11. A charge storage device comprising:
a semiconductor substrate having a surface region;
a charge trapping material overlying the surface region of the semiconductor substrate, the charge trapping material being characterized by a first dielectric constant which is higher than a dielectric constant associated with silicon oxide, the charge trapping material being also characterized by a first charge trapping capability;
a dielectric material being formed by converting a portion of the charge trapping material;
an interface charge trapping region between the dielectric material and the charge trapping material; and
a conductive material overlying the dielectric material, the conductive material being capable of receiving an electrical signal to cause electrical charges being trapped in the charge storage device;

wherein the charge trapping material, the interface charge trapping region, and the dielectric material form a composite dielectric characterized by a second charge trapping capability, the second charge trapping capability being higher than the first charge trapping capability;

wherein the first and the second charge trapping capabilities are associated with threshold voltage shifts caused by electrical charges being trapped in the charge storage device.

12. The charge storage device of claim 11 wherein the charge trapping material is in direct contact with the surface region of the semiconductor substrate.

13. The charge storage device of claim 11 wherein the surface region of the semiconductor substrate comprises a layer of native oxide.

14. The charge storage device of claim 11 wherein the surface region of the semiconductor substrate comprises a layer of silicon oxide, the layer of silicon oxide being characterized by a thickness selected to allow charge tunneling and relatively low charge retention capability.

15. The charge storage device of claim 11 wherein the second charge trapping capability enables an additional threshold voltage shift of more than 1.0 volts in the device as compared with the first charge trapping capability.

* * * * *